(12) United States Patent
Camacho et al.

(10) Patent No.: US 9,142,514 B2
(45) Date of Patent: *Sep. 22, 2015

(54) SEMICONDUCTOR DEVICE AND METHOD OF FORMING WAFER LEVEL DIE INTEGRATION

(75) Inventors: Zigmund R. Camacho, Singapore (SG); Dioscoro A. Merilo, Singapore (SG); Lionel Chien Hui Tay, Singapore (SG); Frederick R. Dahilig, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 9 days.

This patent is subject to a terminal disclaimer.

(21) Appl. No.: 13/546,726

(22) Filed: Jul. 11, 2012

(65) Prior Publication Data

US 2012/0276691 A1 Nov. 1, 2012

Related U.S. Application Data

(62) Division of application No. 11/949,133, filed on Dec. 3, 2007, now Pat. No. 8,241,954.

(51) Int. Cl.
*H01L 21/00* (2006.01)
*H01L 23/538* (2006.01)
(Continued)

(52) U.S. Cl.
CPC ............. *H01L 23/5389* (2013.01); *H01L 24/18* (2013.01); *H01L 24/82* (2013.01);
(Continued)

(58) Field of Classification Search
CPC . H01L 23/28; H01L 23/3114; H01L 25/0657; H01L 24/97; H01L 2224/48091; H01L 23/49531; H01L 23/50; H01L 23/538; H01L 23/488; H01L 23/5226; H01L 23/5389; H01L 23/53295; H01L 23/3107; H01L 2224/73265; H01L 24/10; H01L 24/13; H01L 24/82; H01L 24/18; H01L 24/14; H01L 2924/1532; H01L 21/76804; H01L 21/76805; H01L 21/76877
USPC ......... 257/777, 778, 723, 686, 734, 737, 738, 257/783, 779, 772, 690; 438/108, 109, 612, 438/613, 614
See application file for complete search history.

(56) References Cited

U.S. PATENT DOCUMENTS 6,181,569 B1 1/2001 Chakravorty
6,350,668 B1 2/2002 Chakravorty
(Continued)

OTHER PUBLICATIONS

Garrou, Philip et al., Future ICs Go Vertical, MCNC Research & Development Institute, Semiconductor International, Feb. 1, 2005, http://www.reed-electronics.com/semiconductor, pp. 1-9.
Franzon, Paul et al., High Frequency, High Density Interconnect Using AC Coupling, AC Coupled Interconnection (ACCI), Materials Research Society, www.mrs.org/s_mrs/sec_subscribe.asp?CID=2617&DID=115816&action=detail.
(Continued)

*Primary Examiner* — Thanh Y Tran
(74) *Attorney, Agent, or Firm* — Robert D. Atkins; Patent Law Group: Atkins and Associates, P.c.

(57) ABSTRACT

In a wafer level chip scale package (WLCSP), a semiconductor die has active circuits and contact pads formed on its active surface. A second semiconductor die is disposed over the first semiconductor die. A first redistribution layer (RDL) electrically connects the first and second semiconductor die. A third semiconductor die is disposed over the second semiconductor die. The second and third semiconductor die are attached with an adhesive. A second RDL electrically connects the first, second, and third semiconductor die. The second RDL can be a bond wire. Passivation layers isolate the RDLs and second and third semiconductor die. A plurality of solder bumps is formed on a surface of the WLCSP. The solder bumps are formed on under bump metallization which electrically connects to the RDLs. The solder bumps electrically connect to the first, second, or third semiconductor die through the first and second RDLs.

20 Claims, 3 Drawing Sheets

(51) Int. Cl.
*H01L 23/00* (2006.01)
*H01L 25/065* (2006.01)
*H01L 25/00* (2006.01)
*H01L 23/31* (2006.01)

(52) U.S. Cl.
CPC ............ *H01L25/0657* (2013.01); *H01L 25/50* (2013.01); *H01L 23/3114* (2013.01); *H01L 24/48* (2013.01); *H01L 2224/18* (2013.01); *H01L 2224/48145* (2013.01); *H01L 2224/48464* (2013.01); *H01L 2225/06506* (2013.01); *H01L 2225/06524* (2013.01); *H01L 2924/014* (2013.01); *H01L 2924/01005* (2013.01); *H01L 2924/01013* (2013.01); *H01L 2924/01023* (2013.01); *H01L 2924/01024* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/14* (2013.01); *H01L 2924/15184* (2013.01); *H01L 2924/15311* (2013.01); *H01L 2924/30105* (2013.01)

(56) References Cited

U.S. PATENT DOCUMENTS

| | | | |
|---|---|---|---|
| 6,368,896 B2 | 4/2002 | Farnworth et al. | |
| 6,512,298 B2 * | 1/2003 | Sahara et al. | 257/773 |
| 6,841,418 B2 | 1/2005 | Jeung et al. | |
| 6,924,173 B2 | 8/2005 | Watase et al. | |
| 6,960,826 B2 | 11/2005 | Ho et al. | |
| 7,129,584 B2 | 10/2006 | Lee | |
| 7,129,684 B2 | 10/2006 | Park | |
| 7,327,032 B2 | 2/2008 | Yoon | |
| 8,241,954 B2 * | 8/2012 | Camacho et al. | 438/108 |
| 2002/0146859 A1 | 10/2002 | Akagawa | |
| 2003/0116861 A1 * | 6/2003 | Jeung et al. | 257/778 |
| 2003/0134496 A1 | 7/2003 | Lee et al. | |
| 2004/0245630 A1 * | 12/2004 | Huang et al. | 257/737 |
| 2006/0019480 A1 * | 1/2006 | Cheng et al. | 438/612 |
| 2006/0103020 A1 * | 5/2006 | Tong et al. | 257/738 |
| 2009/0115058 A1 * | 5/2009 | Yu et al. | 257/738 |
| 2009/0117702 A1 * | 5/2009 | Lin et al. | 438/381 |

* cited by examiner

SEMICONDUCTOR DEVICE AND METHOD OF FORMING WAFER LEVEL DIE INTEGRATION

CLAIM TO DOMESTIC PRIORITY

The present application is a division of U.S. patent application Ser. No. 11/949,133, now U.S. Pat. No. 8,241,954, filed Dec. 3, 2007, which application is incorporated herein by reference.

FIELD OF THE INVENTION

The present invention relates in general to semiconductor devices and, more particularly, to wafer level die integration.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to achieve wafer level die integration between two or more semiconductor devices. The interconnect between the semiconductor die has been achieved with through hole conductive vias and redistribution layers. However, through hole conductive vias are difficult to form and require die area or space around a periphery of the die. It is desirable to reduce the area needed for interconnect between semiconductor die in WLCSP.

SUMMARY OF THE INVENTION

In one embodiment, the present invention is a method of making a semiconductor device comprising the step of providing a first semiconductor die, mounting a second semiconductor die over the first semiconductor die, forming a first insulating layer over the first semiconductor die and around the second semiconductor die, forming a conductive layer over the first insulating layer that electrically connects contact pads on the first and second semiconductor die, and forming an interconnect structure over the conductive layer.

In another embodiment, the present invention is a method of making a semiconductor device comprising the step of providing a first semiconductor die, mounting a second semiconductor die over the first semiconductor die, forming a first insulating layer over the first semiconductor die and around the second semiconductor die, and forming a conductive layer over the first insulating layer that electrically connects contact pads on the first and second semiconductor die.

In another embodiment, the present invention is a method of making a semiconductor device comprising the steps of providing a first semiconductor die, mounting a second semiconductor die over the first semiconductor die, forming a first insulating layer over the first semiconductor die and around the second semiconductor die, and forming a conductive layer over the first insulating layer.

In another embodiment, the present invention is a method of making a semiconductor device comprising the steps of providing a first semiconductor die, mounting a second semiconductor die over the first semiconductor die, forming a first insulating layer over the first semiconductor die, and forming a conductive layer over the first insulating layer.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
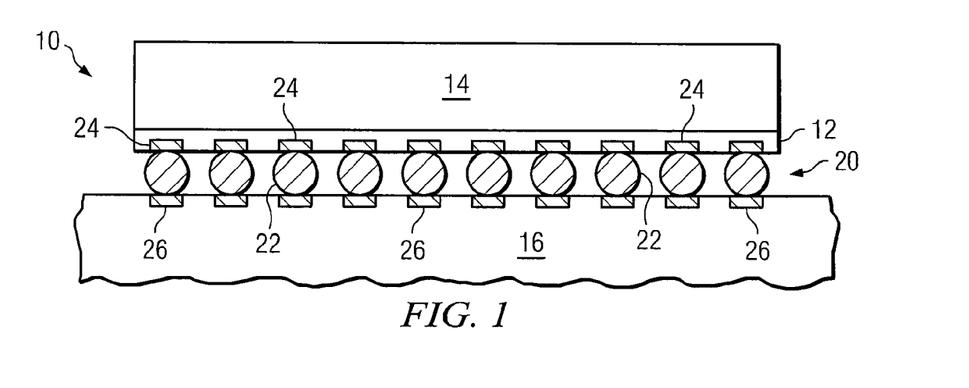
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads or interconnect sites 24, which are disposed on active area 12. The bump pads 24 connect to the active circuits by conduction tracks in active area 12. The solder bumps 22 are electrically and mechanically connected to contact pads or interconnect sites 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Figure 2:
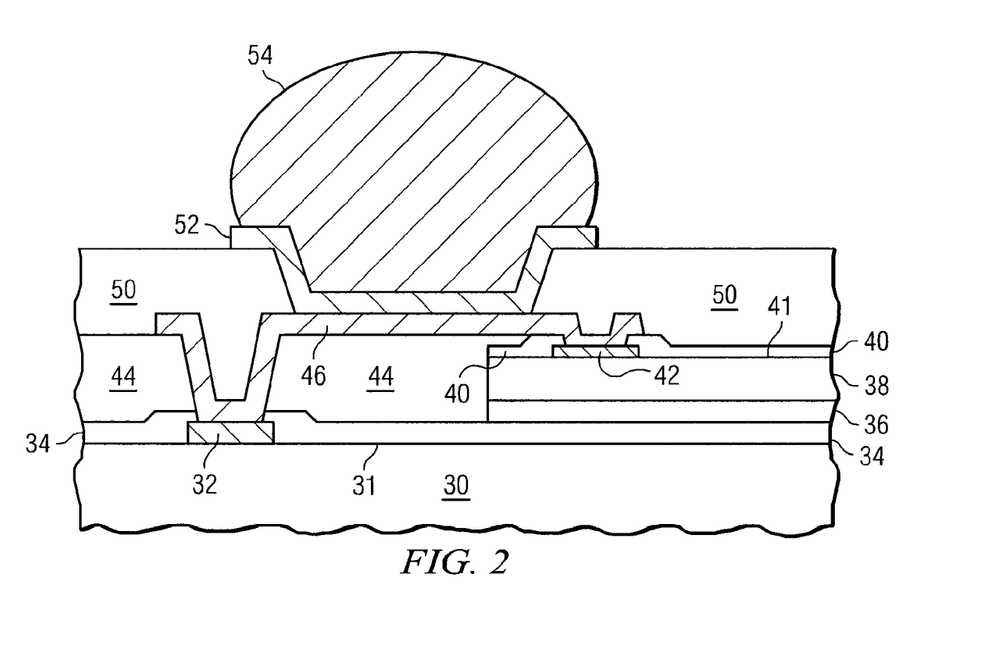
FIG. 2 illustrates an interconnect structure between two semiconductor die using RDL.

FIGS. 2-6 illustrate various embodiments of an inter-level die interconnect structure for use with WLCSP or other semiconductor devices. FIG. 2 is a cross-sectional view of one exemplary formation of the die interconnect structure. Semiconductor die 30 is formed on a substrate which is made of silicon or other bulk semiconductor material. Semiconductor die 30 is part of a base semiconductor wafer, which contains additional semiconductor die. Semiconductor die 30 includes an active surface 31 containing active and passive devices, conductive layers, and dielectric layers according to the electrical design of the die. A conductive layer 32 is formed as a contact pad on active surface 31 using a patterning and deposition process. Semiconductor die 30 has a number of contact pads like 32. Conductive layer 32 can be made with aluminum (Al), copper (Cu), tin (Sn), nickel (Ni), gold (Au), silver (Ag), or other electrically conductive material. The deposition of conductive layer 32 uses an electrolytic plating or electroless plating process.

A passivation layer 34 is formed over semiconductor die 30 and conductive layer 32 for structural support and physical isolation. Passivation layer 34 can be made with silicon nitride (SiN), silicon dioxide (SiO2), silicon oxynitride (SiON), polyimide (PI), benzocyclobutene (BCB), polybenzoxazole (PBO), or other insulating material. A portion of passivation layer 34 is removed using a mask-defined photoresist etching process to expose conductive layer 32.

A die attach adhesive layer 36 is formed on passivation layer 34. In one embodiment, adhesive layer 36 is about 5-15 μm in thickness. Adhesive layer 36 can be thermal epoxy, epoxy resin, B-stage epoxy laminating film, a suitable wafer backside coating, epoxy resin with organic filler, silica filler, or polymer filler, acrylate based adhesive, epoxy-acrylate adhesive, or a PI-based adhesive. Adhesive layer 36 is generally only minimally conductive. In some embodiments, however, adhesive layer 36 includes a non-conductive material. A second semiconductor die 38 is placed on die attach adhesive layer 36. Semiconductor die 38 has a substrate which is made of silicon or other bulk semiconductor material. Semiconductor die 38 includes an active surface 41 containing active and passive devices, conductive layers, and dielectric layers according to the electrical design of the die. Semiconductor die 38 has less height than semiconductor die 30. In one embodiment, semiconductor die 38 is 25-75 μm in height. A conductive layer 42 is formed as a contact pad on active surface 41 using a patterning and deposition process. Semiconductor die 38 has a number of contact pads like 42. Conductive layer 42 can be made with Al, Cu, Sn, Ni, Au, Ag, or other electrically conductive material. The deposition of conductive layer 42 uses an electrolytic plating or electroless plating process.

A passivation layer 40 is formed over semiconductor die 38 and conductive layer 42 for structural support and physical isolation. Passivation layer 40 can be made with SiN, SiO2, SiON, PI, BCB, PBO, or other insulating material. A portion of passivation layer 40 is removed using a mask-defined etching process to expose conductive layer 42.

A passivation layer 44 is formed over passivation layer 34, conductive layer 32, and a portion of passivation layer 40 for structural support and physical isolation. Passivation layer 44 can be made with SiN, SiO2, SiON, PI, BCB, PBO, or other insulating material. A portion of passivation layer 44 is removed using a mask-defined etching process to expose conductive layer 32.

A redistribution layer (RDL) 46 is deposited over and follows the contour of passivation layers 44 and 40 and conductive layers 32 and 42. RDL 46 can be made with Al, Ni, nickel vanadium (NiV), Cu, or Cu alloy. RDL 46 can be made by an electrolytic plating or electroless plating process. RDL 46 can be made with a single layer, or multiple layers using an adhesion layer of Ti, TiW, or Cr. RDL 46 operates as an intermediate conduction layer to electrically connect conductive layers 32 and 42 and may route electrical signals between semiconductor die 30 and 38. The WLCSP has a number of RDLs like 46 to form a network of inter-level interconnects which may electrically connect to the contact pads of semiconductor die 30 to the contact pads of semiconductor die 38 according to the function of the semiconductor device.

A passivation layer 50 is formed over passivation layers 44 and 40 and RDL 46 for structural support and physical isolation. Passivation layer 50 can be made with SiN, SiO2, SiON, PI, BCB, PBO, or other insulating material. A portion of passivation layer 50 is removed using a mask-defined etching process to expose a portion of RDL 46.

A metal layer 52 is deposited over passivation layer 50 and RDL 46 by an evaporation, electrolytic plating, electroless plating, or screen printing process. Metal layer 52 is an under bump metallization (UBM) layer which follows the contour of passivation layer 50 and RDL 46. UBM 52 can be made with Ti, Ni, NiV, Cu, or Cu alloy.

An electrically conductive solder material is deposited over UBM 52 using an electrolytic plating or electroless plating process. The solder material can be any metal or electrically conductive material, e.g., Sn, lead (Pb), Ni, Au, Ag, Cu, bismuthinite (Bi) and alloys thereof, or mixtures of other electrically conductive material. In one embodiment, the solder material is 63 percent weight of Sn and 37 percent weight of Pb. The solder material is reflowed by heating the conductive material above its melting point to form spherical ball or bump 54. In one embodiment, solder bump 54 is about 75 μm in height. In some applications, solder bump 54 is reflowed a second time to improve electrical contact to the UBM structure. The WLCSP has a number of solder bumps like 54 which electrically connect the network of RDLs like 46 to provide a complete inter-level interconnect for semiconductor die 30 and 38 according to its functional design. The electrical signals from semiconductor die 30 and 38 are routed through the network of RDLs to one or more of the solder bumps 54 according to the function of the semiconductor device.

The interconnect structure shown in FIG. 2 electrically connects electrical signals from semiconductor die 30 through conductive layer 32 and RDL 46 to semiconductor die 38 by way of conductive layer 42 and further to solder bump 54 by way of UBM 52. RDLs 46 provide a complete inter-level interconnect structure for the WLCSP without using through hole vias which saves space in the WLCSP.

Figure 3:
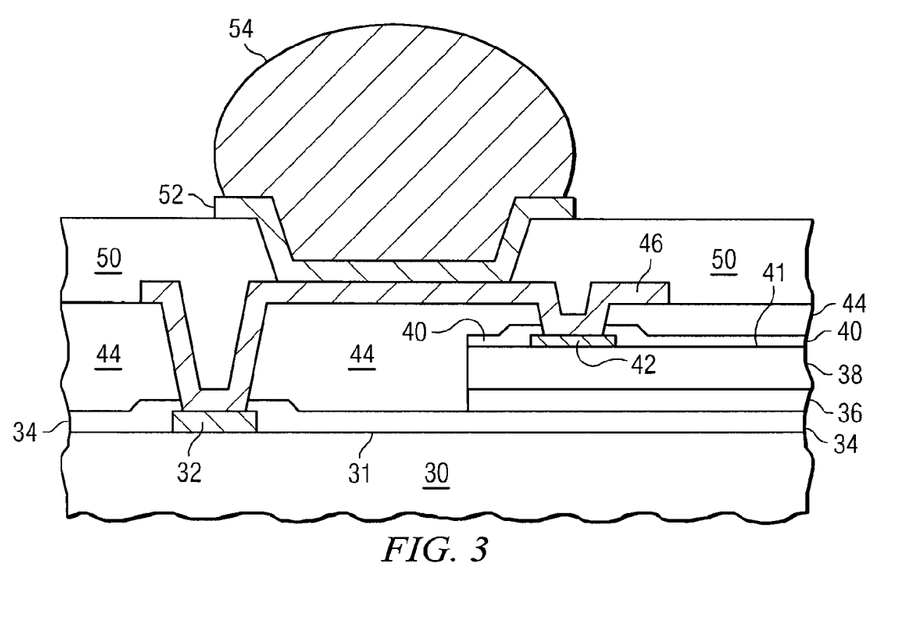
FIG. 3 illustrates an alternate interconnect structure between two semiconductor die using RDL.

FIG. 3 is a cross-sectional view of another embodiment of the die interconnect structure. As described in FIG. 2, semiconductor die 30 is formed on a substrate which is made of silicon or other bulk semiconductor material. Semiconductor die 30 is part of a base semiconductor wafer, which contains additional semiconductor die. Semiconductor die 30 includes an active surface 31 containing active and passive devices, conductive layers, and dielectric layers according to the electrical design of the die. A conductive layer 32 is formed as a contact pad on active surface 31 using a patterning and deposition process. Semiconductor die 30 has a number of contact pads like 32. A passivation layer 34 is formed over semiconductor die 30 and conductive layer 32 for structural support and physical isolation. A portion of passivation layer 34 is removed using a mask-defined etching process to expose conductive layer 32.

A die attach adhesive layer 36 is formed on passivation layer 34. A second semiconductor die 38 is placed on die attach adhesive layer 36. Semiconductor die 38 has a substrate which is made of silicon or other bulk semiconductor material. Semiconductor die 38 includes an active surface 41 containing active and passive devices, conductive layers, and dielectric layers according to the electrical design of the die. A conductive layer 42 is formed as a contact pad on active surface 41 using a patterning and deposition process. Semiconductor die 38 has a number of contact pads like 42. A passivation layer 40 is formed over semiconductor die 38 and conductive layer 42 for structural support and physical isolation. A portion of passivation layer 40 is removed using a mask-defined etching process to expose conductive layer 42. A passivation layer 44 is formed over passivation layers 34 and 40 and conductive layers 32 and 42 for structural support and physical isolation. Passivation layer 44 extends over passivation layer 40 above active surface 41 of semiconductor die 38. A portion of passivation layer 44 is removed using a mask-defined etching process to expose conductive layer 32 and 42. RDL 46 is deposited over and follows the contour of passivation layers 44 and 40 and conductive layers 32 and 42. RDL 46 operates as an intermediate conduction layer to electrically connect conductive layers 32 and 42 and may route electrical signals between semiconductor die 30 and 38. The WLCSP has a number of RDLs like 46 to form a network of inter-level interconnects which may electrically connect the contact pads of semiconductor die 30 to the contact pads of semiconductor die 38 according to the function of the semiconductor device. A passivation layer 50 is formed over and follows the contour of passivation layers 44 and 40 and RDL 46 for structural support and physical isolation.

A portion of passivation layer 50 is removed using a mask-defined etching process to expose a portion of RDL 46. A metal layer 52 is deposited over passivation layer 50 and RDL 46 by an evaporation, electrolytic plating, electroless plating, or screen printing process. Metal layer 52 is the UBM layer which follows the contour of passivation layer 50 and RDL 46. An electrically conductive solder material is deposited over UBM 52 using an electrolytic plating or electroless plating process. The solder material is reflowed by heating the conductive material above its melting point to form spherical ball or bump 54. The WLCSP has a number of solder bumps like 54 which electrically connect a network of RDLs like 46 to provide a complete inter-level interconnect for semiconductor die 30 and 38. The electrical signals from semiconductor die 30 and 38 are routed through the network of RDLs to one or more of the solder bumps 54 according to the function of the semiconductor device.

RDL 46 can be extended over passivation layer 40, above semiconductor die 38, with additional UBMs and solder bumps formed on the RDL for further interconnectivity.

The interconnect structure shown in FIG. 3 electrically connects electrical signals from semiconductor die 30 through conductive layer 32 and RDL 46 to semiconductor die 38 by way of conductive layer 42 and further to solder bump 54 by way of UBM 52. RDLs 46 provide a complete inter-level interconnect structure for the WLCSP without using through hole vias which saves space in the WLCSP.

Figure 4:
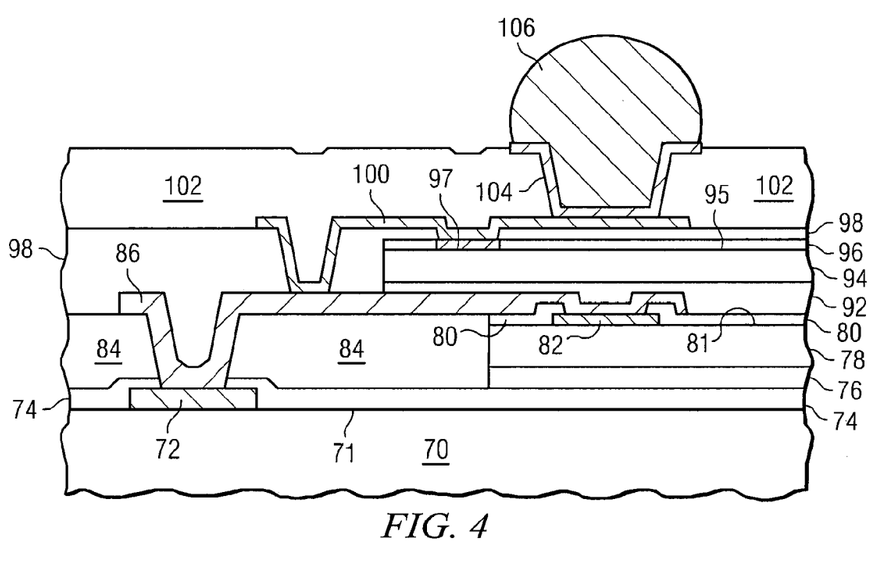
FIG. 4 illustrates an interconnect structure between three semiconductor die using RDL.

Another die interconnect structure is shown in FIG. 4. Semiconductor die 70 is formed on a substrate which is made of silicon or other bulk semiconductor material. Semiconductor die 70 is part of a base semiconductor wafer, which contains additional semiconductor die. Semiconductor die 70 includes an active surface 71 containing active and passive devices, conductive layers, and dielectric layers according to the electrical design of the die. A conductive layer 72 is formed as a contact pad on active surface 71 using a patterning and deposition process. Semiconductor die 70 has a number of contact pads like 72. Conductive layer 72 can be made with Al, Cu, Sn, Ni, Au, Ag, or other electrically conductive material. The deposition of conductive layer 72 uses an electrolytic plating or electroless plating process.

A passivation layer 74 is formed over semiconductor die 70 and conductive layer 72 for structural support and physical isolation. Passivation layer 74 can be made with SiN, SiO2, SiON, PI, BCB, PBO, or other insulating material. A portion of passivation layer 74 is removed using a mask-defined etching process to expose conductive layer 72.

A die attach adhesive layer 76 is formed on passivation layer 74. In one embodiment, adhesive layer 76 is about 5-15 μm in thickness. Adhesive layer 76 can be thermal epoxy, epoxy resin, B-stage epoxy laminating film, a suitable wafer backside coating, epoxy resin with organic filler, silica filler, or polymer filler, acrylate based adhesive, epoxy-acrylate adhesive, or a PI-based adhesive. Adhesive layer 76 is generally only minimally conductive. In some embodiments, however, adhesive layer 76 includes a non-conductive material. A second semiconductor die 78 is placed on die attach adhesive layer 76. Semiconductor die 78 has a substrate which is made of silicon or other bulk semiconductor material. Semiconductor die 78 includes an active surface 81 containing active and passive devices, conductive layers, and dielectric layers according to the electrical design of the die. Semiconductor die 78 has less height than semiconductor die 70. In one embodiment, semiconductor die 78 is approximately 25-75 µm in height. A conductive layer 82 is formed as a contact pad on active surface 81 using a patterning and deposition process. Semiconductor die 78 has a number of contact pads like 82. Conductive layer 82 can be made with Al, Cu, Sn, Ni, Au, Ag, or other electrically conductive material. The deposition of conductive layer 82 uses an electrolytic plating or electroless plating process.

A passivation layer 80 is formed over semiconductor die 78 and conductive layer 82 for structural support and physical isolation. Passivation layer 80 can be made with SiN, SiO2, SiON, PI, BCB, PBO, or other insulating material. A portion of passivation layer 80 is removed using a mask-defined etching process to expose conductive layer 82.

A passivation layer 84 is formed over passivation layer 74 and conductive layer 72 for structural support and physical isolation. Passivation layer 84 can be made with SiN, SiO2, SiON, PI, BCB, PBO, or other insulating material. A portion of passivation layer 84 is removed using a mask-defined etching process to expose conductive layer 72.

An RDL 86 is deposited over and follows the contour of passivation layers 84 and 80 and conductive layers 72 and 82. RDL 86 can be made with Al, Ni, NiV, Cu, or Cu alloy. RDL 86 can be made by an electrolytic plating or electroless plating process. RDL 86 can be made with a single layer, or multiple layers using an adhesion layer of Ti, TiW, or Cr. RDL 86 operates as an intermediate conduction layer to electrically connect conductive layers 72 and 82 and may route electrical signals between semiconductor die 70 and 78. The WLCSP has a number of RDLs like 86 to form a network of inter-level interconnects which may electrically connect the contact pads of semiconductor die 70 to the contact pads of semiconductor die 78 according to the function of the semiconductor device.

A die attach adhesive layer 92 is formed on RDL 86 and passivation layer 80. In one embodiment, adhesive layer 92 is about 5-15 µm in thickness. Adhesive layer 92 can be thermal epoxy, epoxy resin, B-stage epoxy laminating film, a suitable wafer backside coating, epoxy resin with organic filler, silica filler, or polymer filler, acrylate based adhesive, epoxy-acrylate adhesive, or a PI-based adhesive. Adhesive layer 92 is generally only minimally conductive. In some embodiments, however, adhesive layer 92 includes a non-conductive material. A third semiconductor die 94 is placed on die attach adhesive layer 92. Semiconductor die 94 has a substrate which is made of silicon or other bulk semiconductor material. Semiconductor die 94 includes an active surface 95 containing active and passive devices, conductive layers, and dielectric layers according to the electrical design of the die. Semiconductor die 94 has less height than semiconductor die 70. In one embodiment, semiconductor die 94 is 25-75 µm in height. A conductive layer 97 is formed as a contact pad on active surface 95 using a patterning and deposition process. Semiconductor die 94 has a number of contact pads like 97. Conductive layer 97 can be made with Al, Cu, Sn, Ni, Au, Ag, or other electrically conductive material. The deposition of conductive layer 97 uses an electrolytic plating or electroless plating process.

A passivation layer 96 is formed over semiconductor die 94 for structural support and physical isolation. Passivation layer 96 can be made with SiN, SiO2, SiON, PI, BCB, PBO, or other insulating material. A passivation layer 98 is formed over passivation layers 84, RDL 86, and a portion of passivation layer 96 for structural support and physical isolation. Passivation layer 98 can be made with SiN, SiO2, SiON, PI, BCB, PBO, or other insulating material. A portion of passivation layer 98 is removed using a mask-defined etching process to expose a portion of RDL 86.

An RDL 100 is deposited over and follows the contour of passivation layers 98 and 80. RDL 100 can be made with Al, Ni, NiV, Cu, or Cu alloy. RDL 100 can be made by an electrolytic plating or electroless plating process. RDL 100 can be made with a single layer, or multiple layers using an adhesion layer of Ti, TiW, or Cr. RDL 100 operates as an intermediate conduction layer to electrically connect RDL 86 and conductive layer 97 and may route electrical signals between semiconductor die 70, 78, and 94. The WLCSP has a number of RDLs like 100 to form a network of inter-level interconnects which may electrically connects the network of RDLs like 86 together and further to connect to the contact pads of higher level semiconductor die like 95.

A passivation layer 102 is formed over passivation layers 98 and RDL 100 for structural support and physical isolation. Passivation layer 102 can be made with SiN, SiO2, SiON, PI, BCB, PBO, or other insulating material. A portion of passivation layer 102 is removed using a mask-defined etching process to expose a portion of RDL 100.

A metal layer 104 is deposited over passivation layer 102 and RDL 100 by an evaporation, electrolytic plating, electroless plating, or screen printing process. Metal layer 104 is an UBM layer which follows the contour of passivation layer 102 and RDL 100. UBM 104 can be made with Ti, Ni, NiV, Cu, or Cu alloy.

An electrically conductive solder material is deposited over UBM 104 using an electrolytic plating or electroless plating process. The solder material can be any metal or electrically conductive material, e.g., Sn, Pb, Ni, Au, Ag, Cu, Bi and alloys thereof, or mixtures of other electrically conductive material. In one embodiment, the solder material is 63 percent weight of Sn and 37 percent weight of Pb. The solder material is reflowed by heating the conductive material above its melting point to form spherical ball or bump 106. In one embodiment, solder bump 106 is about 75 µm in height. In some applications, solder bump 106 is reflowed a second time to improve electrical contact to the UBM structure. The WLCSP has a number of solder bumps like 106 which electrically connect to the network of RDLs like 100 to provide a complete interconnect for semiconductor die 70, 78, and 94. The electrical signals from semiconductor die 70, 78, and 94 are routed through the network of RDLs to one or more of the solder bumps 106 according to the function of the semiconductor device.

The interconnect structure shown in FIG. 4 electrically connects electrical signals from semiconductor die 70 through conductive layer 72 and RDL 86 to semiconductor die 78 by way of conductive layer 82 and further to semiconductor die 94 by way of conductive layer 97. RDL 100 routes electrical signals to solder bump 106 by way of UBM 104. RDLs 86 and 100 provide a complete inter-level interconnect structure for the WLCSP without using through hole vias which saves space in the WLCSP.

Figure 5:
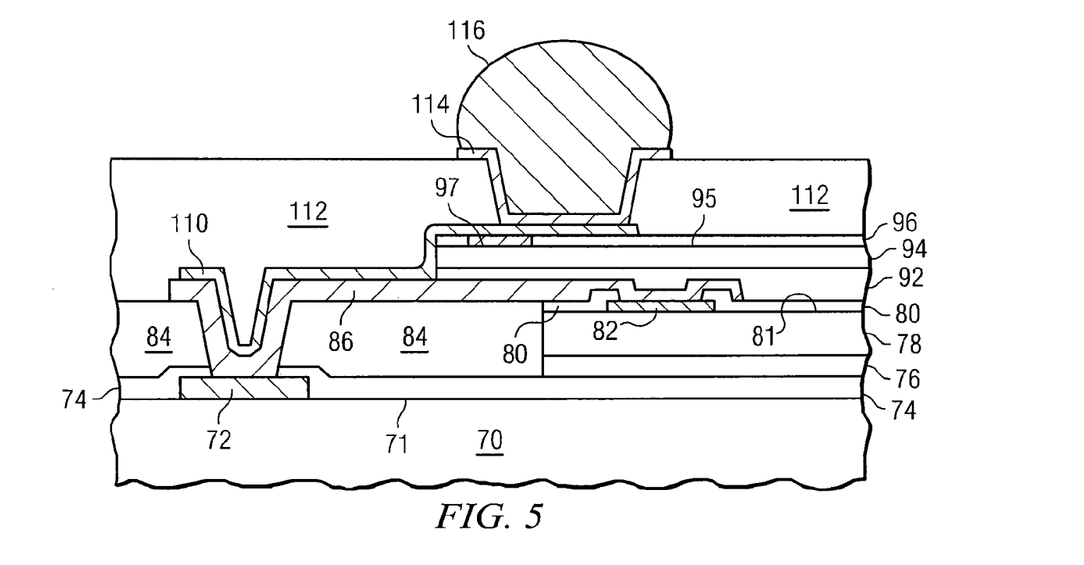
FIG. 5 illustrates an alternate interconnect structure between three semiconductor die using RDL.

In FIG. 5, a cross-sectional view of another die interconnect structure is shown. Semiconductor die 70 is formed on a substrate which is made of silicon or other bulk semiconductor material. Semiconductor die 70 is part of a base semiconductor wafer, which contains additional semiconductor die. Semiconductor die 70 includes an active surface 71 containing active and passive devices, conductive layers, and dielectric layers according to the electrical design of the die. A conductive layer 72 is formed as a contact pad on active surface 71 using a patterning and deposition process. Semiconductor die 70 has a number of contact pads like 72. A passivation layer 74 is formed over semiconductor die 70 and conductive layer 72 for structural support and physical isolation. A portion of passivation layer 74 is removed using a mask-defined etching process to expose conductive layer 72.

A die attach adhesive layer 76 is formed on passivation layer 74. A second semiconductor die 78 is placed on die attach adhesive layer 76. Semiconductor die 78 has a substrate which is made of silicon or other bulk semiconductor material. Semiconductor die 78 includes an active surface 81 containing active and passive devices, conductive layers, and dielectric layers according to the electrical design of the die. A conductive layer 82 is formed as a contact pad on active surface 81 using a patterning and deposition process. Semiconductor die 78 has a number of contact pads like 82. A passivation layer 80 is formed over semiconductor die 78 and conductive layer 82 for structural support and physical isolation. A portion of passivation layer 80 is removed using a mask-defined etching process to expose conductive layer 82. A passivation layer 84 is formed over passivation layer 74 and conductive layer 72 for structural support and physical isolation. A portion of passivation layer 84 is removed using a mask-defined etching process to expose conductive layer 72. An RDL 86 is deposited over and follows the contour of passivation layers 84 and 80 and conductive layers 72 and 82. RDL 86 operates as an intermediate conduction layer to electrically connect conductive layers 72 and 82 and may route electrical signals between semiconductor die 70 and 78. The WLCSP has a number of RDLs like 86 to form a network of inter-level interconnects which may electrically connect the contact pads of semiconductor die 70 to the contact pads of semiconductor die 78 according to the function of the semiconductor device.

A die attach adhesive layer 92 is formed on RDL 86 and passivation layer 80. A third semiconductor die 94 is placed on die attach adhesive layer 92. Semiconductor die 94 has a substrate which is made of silicon or other bulk semiconductor material. Semiconductor die 94 includes an active surface 95 containing active and passive devices, conductive layers, and dielectric layers according to the electrical design of the die. A conductive layer 97 is formed as a contact pad on active surface 95 using a patterning and deposition process. Semiconductor die 94 has a number of contact pads like 97. A passivation layer 96 is formed over semiconductor die 94 for structural support and physical isolation. An RDL 110 is deposited over and follows the contour of RDL 86, passivation layer 95, and conductive layer 97. RDL 110 steps up to passivation layer 85 and conductive layer 97. RDL 110 operates as an intermediate conduction layer to electrically connect RDL 86 and conductive layer 97 and may route electrical signals between semiconductor die 70, 78, and 94. The WLCSP has a number of RDLs like 110 to form a network of inter-level interconnects which may electrically connect the network of RDLs like 86 together and further to connect to the contact pads of higher level semiconductor die like 95.

A passivation layer 112 is formed over passivation layers 84 and 96 and RDL 110 for structural support and physical isolation. Passivation layer 112 can be made with SiN, SiO2, SiON, PI, BCB, PBO, or other insulating material. A portion of passivation layer 112 is removed using a mask-defined etching process to expose a portion of RDL 110. A metal layer 114 is deposited over passivation layer 112 and RDL 110 by an evaporation, electrolytic plating, electroless plating, or screen printing process. Metal layer 114 is an UBM layer which follows the contour of passivation layer 112 and RDL 110. UBM 114 can be made with Ti, Ni, NiV, Cu, or Cu alloy. An electrically conductive solder material is deposited over UBM 104 using an electrolytic plating or electroless plating process. The solder material is reflowed by heating the conductive material above its melting point to form spherical ball or bump 116. The WLCSP has a number of solder bumps like 116 which electrically connect to the network of RDLs like 110 to provide a complete interconnect for semiconductor die 70, 78, and 94. The electrical signals from semiconductor die 70, 78, and 94 are routed through the network of RDLs to one or more of the solder bumps 116 according to the function of the semiconductor device.

The interconnect structure shown in FIG. 5 electrically connects electrical signals from semiconductor die 70 through conductive layer 72 and RDL 86 to semiconductor die 78 by way of conductive layer 82 and further to semiconductor die 94 by way of conductive layer 97. RDL 110 routes electrical signals to solder bump 116 by way of UBM 114. RDLs 86 and 110 provide a complete inter-level interconnect structure for the WLCSP without using through hole vias which saves space in the WLCSP.

Figure 6:
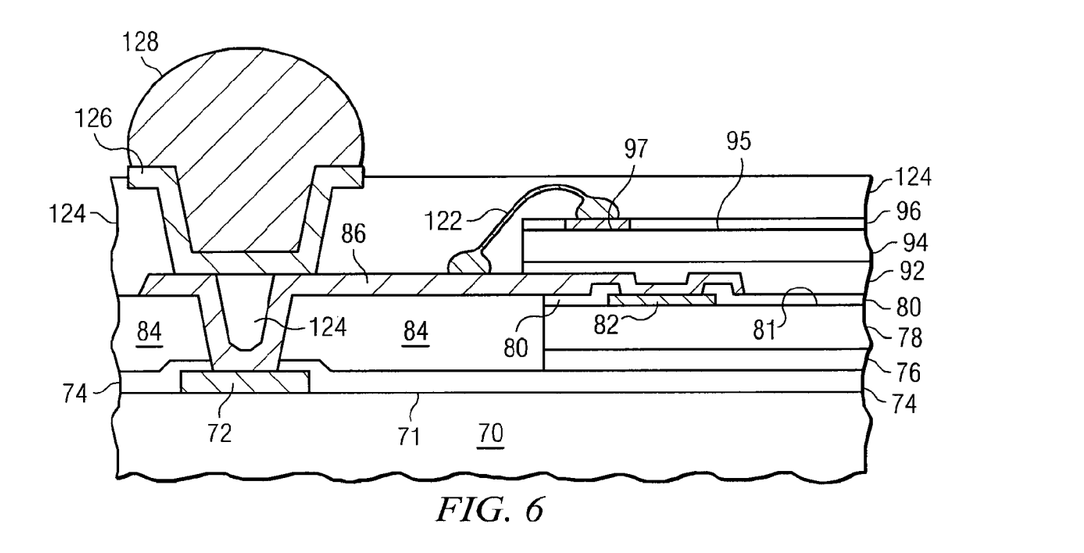
FIG. 6 illustrates an alternate interconnect structure between three semiconductor die using RDL and wire-bonding.

FIG. 6 is a cross-sectional view of another die interconnect structure. Semiconductor die 70 is formed on a substrate which is made of silicon or other bulk semiconductor material. Semiconductor die 70 is part of a base semiconductor wafer, which contains additional semiconductor die. Semiconductor die 70 includes an active surface 71 containing active and passive devices, conductive layers, and dielectric layers according to the electrical design of the die. A conductive layer 72 is formed as a contact pad on active surface 71 using a patterning and deposition process. Semiconductor die 70 has a number of contact pads like 72. A passivation layer 74 is formed over semiconductor die 70 and conductive layer 72 for structural support and physical isolation. A portion of passivation layer 74 is removed using a mask-defined etching process to expose conductive layer 72.

A die attach adhesive layer 76 is formed on passivation layer 74. A second semiconductor die 78 is placed on die attach adhesive layer 76. Semiconductor die 78 has a substrate which is made of silicon or other bulk semiconductor material. Semiconductor die 78 includes an active surface 81 containing active and passive devices, conductive layers, and dielectric layers according to the electrical design of the die. A conductive layer 82 is formed as a contact pad on active surface 81 using a patterning and deposition process. Semiconductor die 78 has a number of contact pads like 82. A passivation layer 80 is formed over semiconductor die 78 and conductive layer 82 for structural support and physical isolation. A portion of passivation layer 80 is removed using a mask-defined etching process to expose conductive layer 82. A passivation layer 84 is formed over passivation layer 74 and conductive layer 72 for structural support and physical isolation. A portion of passivation layer 84 is removed using a mask-defined etching process to expose conductive layers 72. An RDL 86 is deposited over and follows the contour of passivation layers 84 and 80 and conductive layers 72 and 82. RDL 86 operates as an intermediate conduction layer to electrically connect conductive layers 72 and 82 and may route electrical signals between semiconductor die 70 and 78. The WLCSP has a number of RDLs like 46 to form a network of inter-level interconnects which may electrically connect the contact pads of semiconductor die 70 to the contact pads of semiconductor die 78 according to the function of the semiconductor device.

A die attach adhesive layer 92 is formed on RDL 86 and passivation layer 80. A third semiconductor die 94 is placed on die attach adhesive layer 92. Semiconductor die 94 has a substrate which is made of silicon or other bulk semiconductor material. Semiconductor die 94 includes an active surface 95 containing active and passive devices, conductive layers, and dielectric layers according to the electrical design of the die. A conductive layer 97 is formed as a contact pad on active surface 95 using a patterning and deposition process. Semiconductor die 94 has a number of contact pads like 97.

A passivation layer 96 is formed over semiconductor die 94 for structural support and physical isolation. Bond wire 122 electrically connects RDL 86 to conductive layer 97. Bond wire 122 represents another type of intermediate conduction layer. A passivation layer 124 is formed over passivation layer 84, RDL 86, and semiconductor die 94 for structural support and physical isolation. Passivation layer 124 can be made with SiN, SiO2, SiON, PI, BCB, PBO, or other insulating material. A portion of passivation layer 124 is removed using a mask-defined etching process to expose a portion of RDL 86. A metal layer 126 is deposited as an UBM layer which follows the contour of passivation layer 124 and RDL 86. An electrically conductive solder material is deposited over UBM 126 using an electrolytic plating or electroless plating process. The solder material is reflowed by heating the conductive material above its melting point to form spherical ball or bump 128. The WLCSP has a number of solder bumps like 128 which electrically connect the network RDLs like 86 and bond wires like 122 to provide a complete inter-level interconnect for semiconductor die 70, 78, and 94. The electrical signals from semiconductor die 70, 78, and 94 are routed through the network of RDLs and bond wires to one or more of the solder bumps 128 according to the function of the semiconductor device.

The interconnect structure shown in FIG. 6 electrically connects electrical signals from semiconductor die 70 through conductive layer 72 and RDL 86 to semiconductor die 78 by way of conductive layer 82 and further to semiconductor die 94 by way of conductive layer 97. Bond wire 122 electrically connects electrical signals from semiconductor die 94 to RDL 86. RDL 86 routes electrical signals to solder bump 128 by way of UBM 126. RDLs 86 and bond wires 122 provide a complete inter-level interconnect structure for the WLCSP without using through hole vias which saves space in the WLCSP.

While one or more embodiments of the present invention have been illustrated in detail, the skilled artisan will appreciate that modifications and adaptations to those embodiments may be made without departing from the scope of the present invention as set forth in the following claims.

What is claimed:
1. A method of making a semiconductor device, comprising:
    providing a first semiconductor die;
    disposing a second semiconductor die over the first semiconductor die;
    forming a first insulating layer over the first semiconductor die and around the second semiconductor die;
    forming a conductive layer along a contour of a first opening in the first insulating layer to provide vertical electrical interconnect between the first and second semiconductor die;
    forming a second insulating layer over the conductive layer and disposed within the first opening in the first insulating layer;
    forming an under bump metallization layer over the conductive layer; and
    forming an interconnect structure over the under bump metallization layer with a portion of the under bump metallization layer under the interconnect structure following a contour of the conductive layer.

2. The method of claim 1, wherein the second semiconductor die is thinner than the first semiconductor die and includes a thickness in a range of 25-75 micrometers (μm).

3. The method of claim 1, further including forming vertical electrical interconnect between the first and second semiconductor die without a through hole via (THV).

4. The method of claim 1, wherein the conductive layer forms a complete inter-level interconnect between the first and second semiconductor die.

5. The method of claim 1, further including:
    forming a second opening in the second insulating layer over the conductive layer; and
    forming the interconnect structure partially within the second opening in the second insulating layer.

6. A method of making a semiconductor device, comprising:
    providing a first semiconductor die;
    disposing a second semiconductor die over the first semiconductor die;
    forming a first insulating layer over the first semiconductor die and around the second semiconductor die;
    forming a conductive layer over the first insulating layer that electrically connects the first and second semiconductor die with the first insulating layer extending from the second semiconductor die to a portion of the conductive layer over a contact pad of the first semiconductor die;
    forming an opening in the first insulating layer over the contact pad of the first semiconductor die;
    forming the conductive layer along a contour of the opening in the first insulating layer to provide vertical electrical interconnect between the first and second semiconductor die; and
    forming a second insulating layer over the conductive layer and disposed within the opening in the first insulating layer.

7. The method of claim 6, wherein the first insulating layer includes a planar top surface that extends from the opening in the first insulating layer over the contact pad of the first semiconductor die to the contact pad of the second semiconductor die.

8. The method of claim 6, further including forming an interconnect structure over the conductive layer.

9. The method of claim 8, wherein the interconnect structure includes a bump.

10. The method of claim 8, further including forming an under bump metallization (UBM) disposed between the conductive layer and the interconnect structure.

11. The method of claim 6, further including depositing a die attach adhesive between the first and second semiconductor die.

12. A method of making a semiconductor device, comprising:
    providing a first semiconductor die;
    disposing a second semiconductor die over the first semiconductor die;
    forming a first insulating layer over the first semiconductor die and around the second semiconductor die;
    forming an opening in the first insulating layer over a contact pad of the first semiconductor die;
    forming a conductive layer along a contour of the opening in the first insulating layer to provide vertical electrical interconnect between the first and second semiconductor die; and
    forming a second insulating layer over the conductive layer and disposed within the opening in the first insulating layer.

13. The method of claim 12, further including forming an interconnect structure partially within the opening in the second insulating layer.

14. The method of claim 13, further including forming an under bump metallization (UBM) disposed between the conductive layer and the interconnect structure.

15. The method of claim 12, wherein the first insulating layer includes a planar top surface that extends from the opening in the first insulating layer over a contact pad of the first semiconductor die to a contact pad of the second semiconductor die.

16. The method of claim 12, wherein the second semiconductor die is thinner than the first semiconductor die and includes a thickness in a range of 25-75 micrometers (μm).

17. A method of making a semiconductor device, comprising:
   providing a first semiconductor die;
   disposing a second semiconductor die over the first semiconductor die;
   forming a first insulating layer over the first semiconductor die and around the second semiconductor die;
   forming a conductive layer over the first insulating layer;
   forming an opening in the first insulating layer over a contact pad of the first semiconductor die;
   forming the conductive layer along a contour of the opening in the first insulating layer to provide vertical electrical interconnect between the first and second semiconductor die; and
   forming a second insulating layer over the conductive layer and disposed within the opening in the first insulating layer.

18. The method of claim 17, further including:
   forming an opening in the second insulating layer over the conductive layer; and
   forming an interconnect structure partially within the opening in the second insulating layer.

19. The method of claim 17, wherein the first insulating layer includes a planar top surface that extends from the opening in the first insulating layer over a contact pad of the first semiconductor die to a contact pad of the second semiconductor die.

20. The method of claim 17, further including:
   forming an interconnect structure over the conductive layer; and
   forming an under bump metallization (UBM) disposed between the conductive layer and the interconnect structure.

* * * * *